(12) United States Patent
Oda

(10) Patent No.: US 6,340,845 B1
(45) Date of Patent: Jan. 22, 2002

(54) MEMORY PACKAGE IMPLEMENTING TWO-FOLD MEMORY CAPACITY AND TWO DIFFERENT MEMORY FUNCTIONS

(75) Inventor: Toshiaki Oda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/488,530

(22) Filed: Jan. 21, 2000

(30) Foreign Application Priority Data

Jan. 22, 1999 (JP) ............................................. 11-014668

(51) Int. Cl.⁷ ......................... H01L 23/48; H01L 23/52; H01L 29/40
(52) U.S. Cl. ......................... 257/777; 257/778; 257/686
(58) Field of Search ................................ 257/777, 778, 257/686, 723, 724

(56) References Cited

U.S. PATENT DOCUMENTS

| | | | |
|---|---|---|---|
| 5,614,766 A | * | 3/1997 | Taasu et al. |
| 6,133,626 A | * | 10/2000 | Hawke et al. |
| 6,222,212 B1 | * | 4/2001 | Lee et al. |
| 6,249,136 B1 | * | 6/2001 | Maley |
| 6,252,300 B1 | * | 6/2001 | Hsuan et al. |
| 6,255,736 B1 | * | 7/2001 | Kancko |
| 6,262,488 B1 | * | 7/2001 | Masayuki et al. |

FOREIGN PATENT DOCUMENTS

| | | | |
|---|---|---|---|
| JP | 58-218130 | * | 12/1983 |
| JP | 60-254762 | | 12/1985 |
| JP | 4-280695 | | 10/1992 |
| JP | 5-53249 | | 7/1993 |
| JP | 9-219490 | | 8/1997 |
| JP | 2000-91729 | | 3/2000 |

* cited by examiner

*Primary Examiner*—Sheila V. Clark
(74) *Attorney, Agent, or Firm*—Sughrue Mion, PLLC

(57) ABSTRACT

A memory package is provided being capable of implementing two-fold memory capacity and two different memory functions on the same mounting area as would be required in the case of mounting in one stage. This is achieved by providing the land on the surface of the package composed of one memory device having a ROM-type or RAM-type memory core and by stacking, on the land, the other memory device also having the ROM-type or RAM memory core in two stages in a vertical direction and by mounting internal circuits, on the upper and lower memory devices having the ROM-type or RAM-type memory cores, adapted to control so that the address areas of the upper and lower memory devices having the ROM-type or RAM-type memory cores may not be overlapping.

11 Claims, 7 Drawing Sheets

MEMORY PACKAGE IMPLEMENTING TWO-FOLD MEMORY CAPACITY AND TWO DIFFERENT MEMORY FUNCTIONS

BACKGROUND OF THE INVENTION

1. Field of the Invention

The present invention relates to a memory package and more particularly to a memory package being capable of implementing two-fold memory capacity and two different memory functions on a same mounting area as would be required in a case of mounting in one stage.

2. Description of the Related Art

In recent years, it is required that a terminal of a portable device be smaller and be highly functional and there is, therefore, emerging a need for implementing more functions on smaller area of a mounting board. To achieve higher functions, it is necessary to make a memory device of large capacity and multi-functional in many cases. FIG. 7 is a schematic circuit diagram showing a conventional memory device. For example, if the conventional memory package should be fabricated by employing a memory device 62 having a ROM (Read Only Memory) or RAM (Random Access Memory) packaged in accordance with a BGA (Ball Grid Array) packaging form, the ordinary memory device 62 is resin-molded into one package and a control circuit 61 is connected thereto.

However, since the mounting area is small in the portable device terminal or a like, there is a technological problem in that it is impossible to mount a plurality of the memory devices 62 in the same plane on the mounting area. Furthermore, there is another problem in that, when a capacity of the conventional memory device 62 becomes insufficient due to functional upgrade of the device, even if additional memory devices 62 can be further mounted in terms of mounting areas, an overall revision of the board is inevitable.

SUMMARY OF THE INVENTION

In view of the above, it is an object of the present invention to provide a memory package being capable of implementing two-fold memory capacity and two different memory functions on a same mounting area as would be required in a case of mounting in one stage.

According to an aspect of the present invention, there is provided a memory package for implementing two-fold memory capacity and two different memory functions on the same mounting area as would be required in the case of mounting in one stage comprising;

a plurality of memory devices each having a land formed at a predetermined position on a surface of the memory device on which another memory device is mounted and a connection pin formed at a bottom of the memory device which meets another land formed on another memory device in a one-to-one configuration at a position opposite to the land so as to be electrically connected to each other;

whereby the memory devices are stacked up and down in two stages so that the connection pins formed at the bottom of the upper memory device meet the lands formed at the predetermined position on the surface of the lower memory device on which the upper memory device is overlaid.

In the foregoing, a preferable mode is one wherein the land formed at the predetermined position on the surface of the memory device is connected, through a conductive connection pattern in a one-to-one configuration, to the connection pin formed at a position opposite to the land at the bottom of the memory device so that the land and the pin can meet each other.

Also, a preferable mode is one wherein the memory device is fabricated in accordance with a BGA packaging form.

Also, a preferable mode is one wherein each of the memory devices stacked in two stages is provided with a memory core having a same memory function and these two memory devices are so constructed that, in composite logical memory space produced by logically synthesizing one memory core being addressable by the upper memory device and the other memory core being addressable by the lower memory device, the above one memory core being addressable by the upper memory device is located at an upper part of the composite logical memory space and the other memory core being addressable by the upper memory device is located at a lower part of the composite logical memory space.

Also, a preferable mode is one wherein each of the memory devices stacked in two stages is provided with memory cores each having at least two or more memory functions and these two memory devices are so constructed that, in composite logical memory space produced by logically synthesizing one memory core being addressable by the upper memory device and the other memory core being addressable by the lower memory device, the above one memory core being addressable by the upper memory device is located at an upper part of the composite logical memory space and the other memory core being addressable by the lower memory device is located at a lower part of the composite logical memory space.

Also, a preferable mode is one that wherein comprises a control circuit used to arrange the above one memory core being addressable by the upper memory device at the upper part of the composite logical memory space and the other memory core being addressable by the lower memory device at the lower part of the composite logical memory space and to produce the composite logical memory space by logically synthesizing the above one memory core being addressable by the upper memory device and the other memory core being addressable by the lower memory device and further to perform access to the above one memory core of the upper memory device or to the other memory core of the lower memory device on the basis of the composite logical memory space.

It is also preferable that each of the memory devices stacked up and down in two stages has the memory core with a same memory function and has pins for a chip select signal and for a reserve address signal used to produce the composite logical memory space by logically synthesizing the above one memory core being addressable by the upper memory device and the other memory core being addressable by the lower memory device and wherein the above one memory core being addressable by the upper memory device is arranged at the upper part of the composite logical memory space and the other memory core being addressable by the lower memory device at the lower part of the composite logical memory space depending on a logical level provided to pins for the chip select signal and for the reserve address signal.

Also, it is preferable that each of the memory devices stacked up and down in two stages has the memory core with at least two or more memory functions and has pins for the chip select signal and for the reserve address signal used to produce the composite logical memory space by logically synthesizing the above one memory core being addressable by said upper memory device and the other memory core being addressable by the lower memory device and wherein the above one memory core being addressable by the upper memory device is arranged at the upper part of the composite logical memory space and the other memory core being addressable by the lower memory device at the lower part of the composite logical memory space depending on the logical level provided to pins for the chip select signal and for the reserve address signal.

Also, a preferable mode is one that wherein comprises the control circuit used to arrange the above one memory core being addressable by the upper memory device at the upper part of the composite logical memory space and the other memory core being addressable by the lower memory device at the lower part of the composite logical memory space depending on the logical level provided to pins for the chip select signal and for the reserve address signal and to produce the composite logical memory space by logically synthesizing the above one memory core being addressable by the upper memory device and the other memory core being addressable by the other lower memory device and further to perform access to the memory core of the upper memory device or to the memory core of the lower memory device on the basis of the composite logical memory space.

Also, a preferable mode is one wherein the memory core is provided with ROM functions.

Furthermore, a preferable mode is one wherein the memory core is provided with RAM functions.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
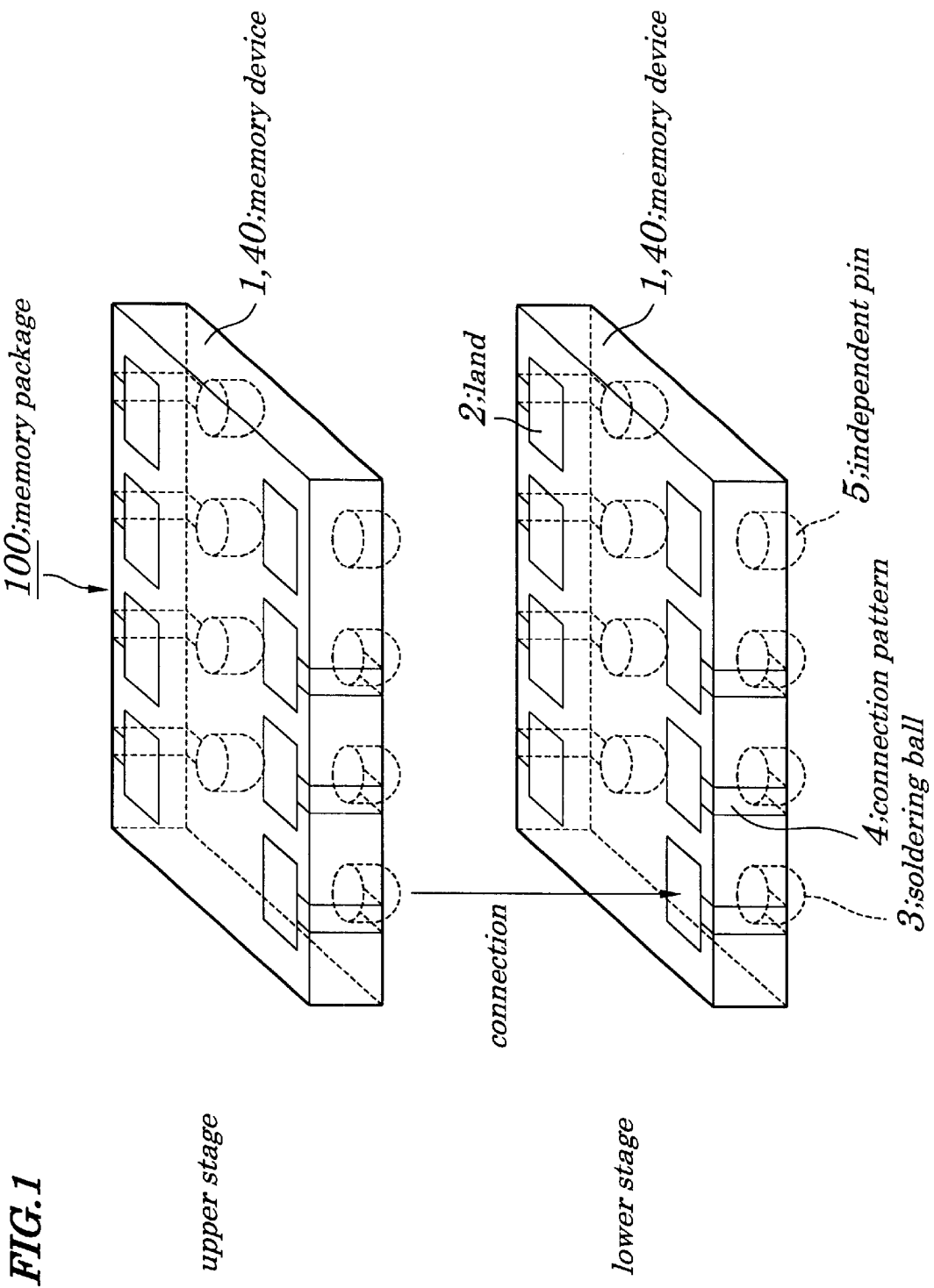
FIG. 1 is a schematic diagram showing a memory package of the present invention, in which one memory device having a ROM-type or RAM-type memory is overlaid on the other memory device also having a ROM-type or RAM-type device up and down in two stages in a vertical direction.

FIG. 1 is a schematic diagram showing a memory package 100 in which one memory device 1 having one ROM (Read Only Memory)-type or RAM (Random Access Memory)-type memory is overlaid on an other memory device 1 also having an other ROM-type or RAM-type device up and down in two stages. According to the first embodiment of the present invention, as shown in FIG. 1, the memory package 100 is comprised of one memory device 1 being fabricated in accordance with a BGA (Ball Grid Array) packaging form and having one ROM-type memory core (as described later) and the other memory device 1 also fabricated in accordance with the BGA packing form and having the other ROM-type memory core (as described later) which are overlaid up and down in two stages in a vertical direction, thus allowing two-fold memory capacity to be implemented on a same mounting area as would be required in the case of mounting in one stage.

Figure 2:
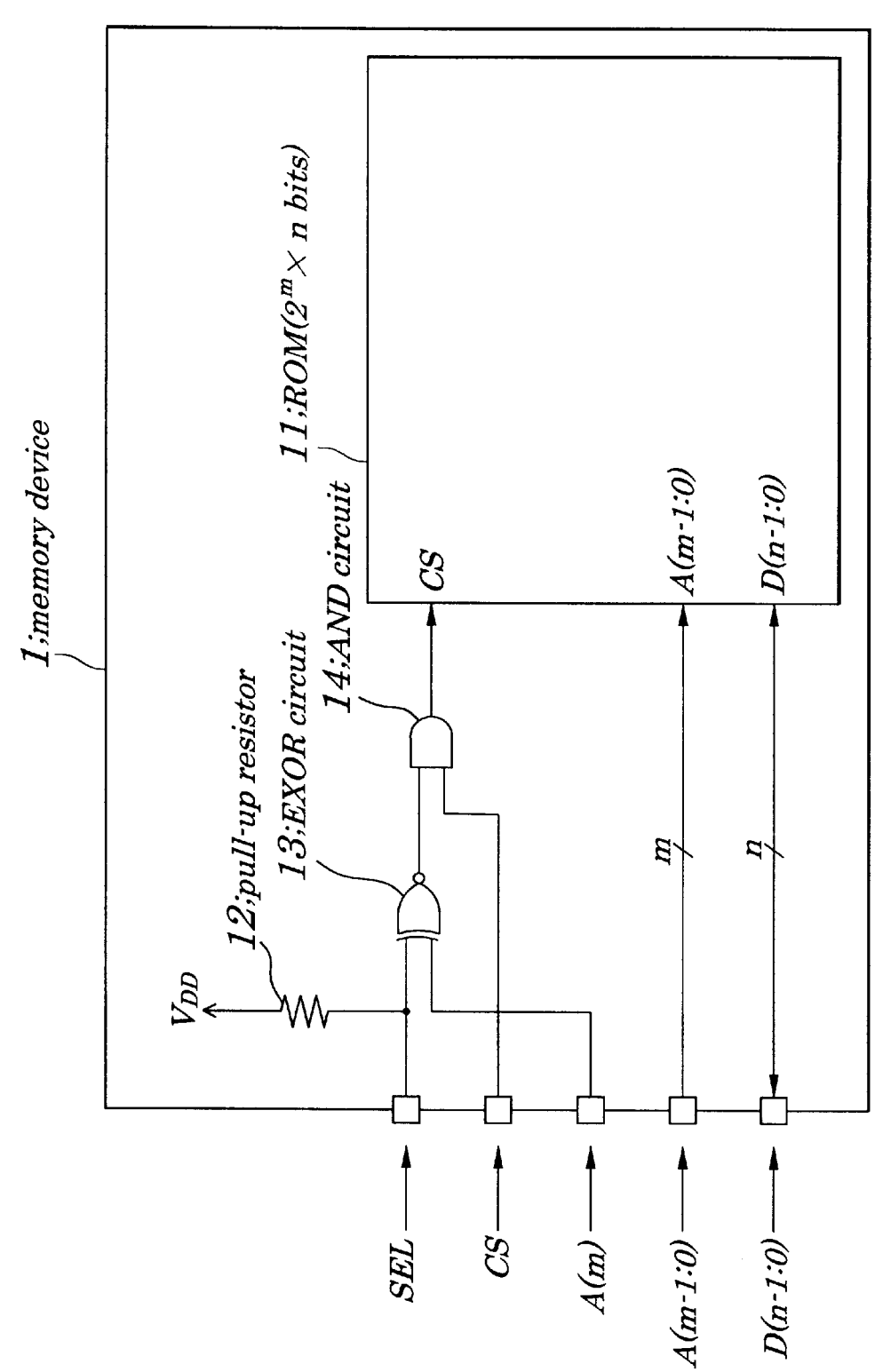
FIG. 2 is a schematic circuit diagram illustrating internal circuit configurations of the memory device of FIG. 1 having the ROM-type memory core, of the present invention.

FIG. 2 is a schematic circuit diagram illustrating internal circuit configurations of the memory device 1 of FIG. 1 having the ROM-type memory core. Referring to FIGS. 1 and 2, the memory device 1 having the ROM-type memory core 11 is provided with a land 2 on an upper surface (i.e., on a surface on which another memory device 1 is overlaid) of the memory package 100 composed of the memory device 1, besides components packaged in accordance with the BGA packaging form.

The land 2 mounted on an upper surface of the lower memory device 1 (i.e., a lower stage memory device) having the ROM-type memory core 11 is electrically connected, in a one-to-one configuration, to a soldering ball 3 mounted on a bottom of the upper memory device 1 (i.e., an upper stage memory device) having the ROM-type memory core 11 via a connection pattern 4, which is located at a position corresponding to (or being opposite to) the land 2 mounted on the lower memory device, That is, all connection pins except an independent pin 5 on the lower memory device 1 are electrically connected to connection pins on the upper memory device 1 through connections between the land 2 and the soldering ball 3.

Moreover, as shown in FIGS. 1 and 2, the upper memory device 1 having one ROM-type memory core 11 and the lower memory device 1 having the other ROM-type memory core 11, both of which are fabricated in accordance with the same BGA packaging form, are overlaid up and down in two stages in the vertical direction in which the soldering ball mounted on the upper memory device 1 having the ROM-type memory core 11 is connected, in a one-to-one configuration, to the land 2 mounted on the lower memory device 1 having the ROM-type memory core 11, thus allowing two-fold memory capacity to be implemented on the same mounting area as would be required in the case of mounting in one stage.

According to the first embodiment of the present invention, the upper memory device 1 having the ROM-type memory core 11 is fabricated in accordance with the BGA packaging form, on the bottom of which the soldering ball 3 is provided to allow each connection pin to be electrically connected between the upper and lower memory devices. On a surface of the lower memory device 1 having one ROM-type memory core 11 is mounted a land 2 so that the land 2 is placed opposite, in a one-to-one configuration, to a soldering ball 3 mounted on the bottom of the upper memory device 1 also having the other ROM-type memory core 11. All connection pins, except a part of pins (i.e., an independent pin 5), fitted to the upper or lower memory device having the ROM-type memory core 11 are electrically connected to pins fitted to its bottom through electrical connection between the soldering ball 3 and the land 2 in a one-to-one configuration via a conductive connection pattern 4. According to the first embodiment, as shown in FIGS. 1 and 2, a memory package 100 is so configured that, when the upper and lower memory devices, each having the ROM-type memory, are overlaid up and down in two stages, the soldering ball 3 mounted on the upper memory device 1 having the ROM-type memory core 11 can meet the land 2 mounted on the lower memory device 1 having the ROM-type memory core, in a one-to-one configuration, to achieve electrical connection.

As depicted in FIG. 2, the memory device 1 has, at least, pins for an address signal A (m−1:0) being m bits in length, a data signal D (n−1:0) being n bits in length, a chip select signal CS and a reserve address signal A (m) being 1 bit in length, a ROM-type memory core 11 with a ROM function, a pull-up resistor 12, an EXOR (Exclusive OR) circuit 13 and an AND circuit 14. The circuit of the memory device 1 is so configured that a logical operation of an output obtained as a result of a logical operation carried out by inputting the reserve address signal A (m) and a select signal SEL into the EXOR circuit 13 and of a chip select signal CS is performed in the AND circuit 14, and a result of the above logical operation is inputted as the chip select signal CS into a CS terminal of the ROM-type memory core 11, then the address signal A (m−1:0) as an address signal is inputted into an A terminal (m−1:0) of the ROM-type memory core 11, and the data signal D (n−1:0) as a data signal is inputted into a D terminal (n−1:0) of the ROM-type memory core 11. The ROM-type memory core 11 has a function being equivalent to that of a conventional memory core and has a circuit in which data being, at least, $2^m \times n$ bits in length can be read in response to the address signal A (m−1:0) being m bits in length, the data signal D (n−1:0) being n bits in length and the chip select signal CS. The select signal SEL is used to differentiate operational address areas of each of the memory device having the ROM-type memory core in the case where the above memory devices 1 having the ROM-type memory core are overlaid up and down in two stages. The pin for the select signal SEL is connected to the independent pin 5 shown in FIG. 1. The soldering ball 3 mounted on the lower surface of the independent pin 5 is not connected to the land 2 mounted on its upper surface (i.e., on a surface on which the other memory device is overlaid). The reserve address signal A (m) is used to increase twice the address areas.

In this circuit, when the select signal SEL is fixed at a logical potential L (i.e., ground potential GND), if the reserve signal A (m) is at the logical potential L (i.e., ground potential GND), the chip select signal CS is inputted into the ROM-type memory core 11, and if the reserve address signal A (m) is at the logical potential H (i.e., power-supply potential $V_{DD}$), the inputting to the CS terminal is inhibited. Moreover, when the SEL terminal is in an open state (i.e., the potential of the SEL terminal is at the logical potential H or the power-supply potential $V_{DD}$), if the reserve address signal A (m) is at the logical potential H (i.e., power-supply voltage $V_{DD}$), the chip select signal CS is inputted into the ROM-type memory core 11, and if the reserve address signal A (m) is at the logical potential L (i.e., ground potential GND), the inputting to the CS terminal is inhibited.

Figure 3:
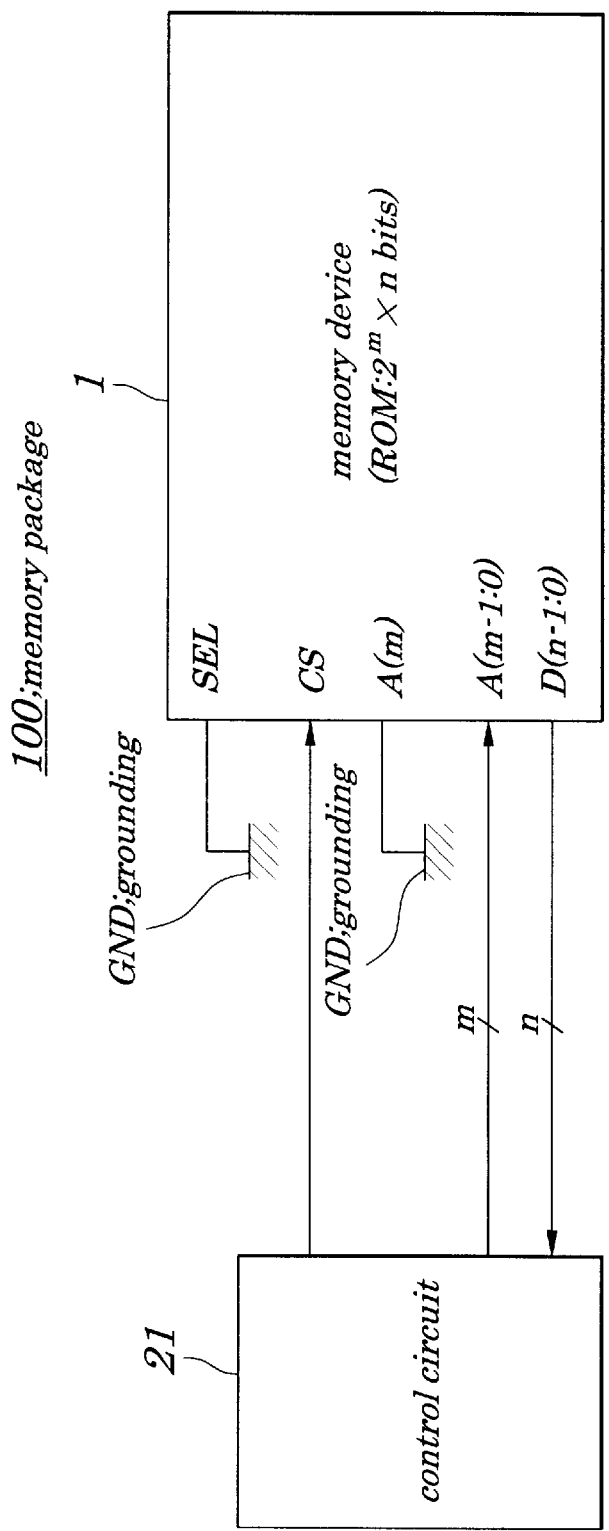
FIG. 3 is a connection diagram of a memory package in which the memory device of FIG. 1 having the ROM-type memory core of FIG. 2 is mounted in only one stage.
Figure 4:
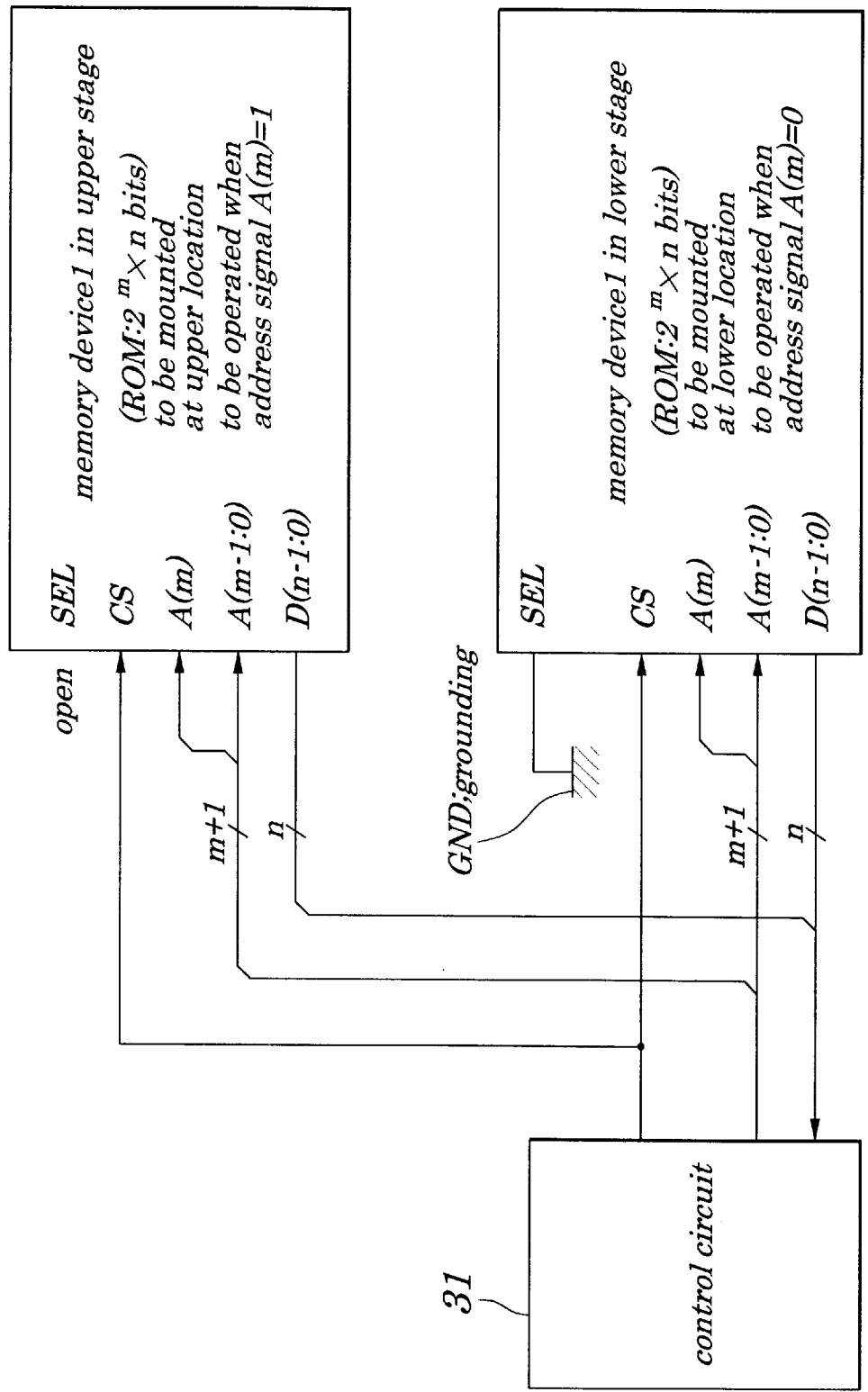
FIG. 4 is a connection diagram of the memory package in which the memory devices of FIG. 1 having the ROM-type memory cores of FIG. 2 are stacked in two stages in a vertical direction.

Operations of the memory package 100 of the first embodiment are described by referring to FIGS. 3 and 4. FIG. 3 is a connection diagram of a memory package 100 in which the memory device 1 of FIG. 1 having the ROM-type memory core 11 of FIG. 2 is stacked in only one stage. In the circuit shown in FIG. 3, a control circuit 21 is adapted to generate the chip select signal CS and the address signal A (m−1:0) and to output both to the ROM-type memory core 11 of FIG. 2, which is then adapted to output the data signal D (n−1:0) in response to both to the control circuit 21.

The control circuit 21 has a function of controlling the ROM-type memory core 11 being at least $2^m \times n$ bits in length. Moreover, the select signal SEL and the reserve address signal A (m) are fixed at the logical potential L (i.e., ground potential GND). The memory device 1 having the ROM-type memory core 11 is so configured that, when the select signal SEL is fixed at the logical potential L (i.e., ground potential GND), if the reserve address signal A (m) is at the logical potential L (i.e., ground potential), the chip select signal CS is inputted to the CS terminal of the ROM-type memory core 11, and if the reserve address signal A (m) is at the logical potential H (i.e., power-supply potential $V_{DD}$), the inputting to the CS terminal of the ROM-type memory core 11 is inhibited. According to this embodiment, since the reserve address signal A (m) is fixed at the logical potential L (i.e., ground potential GND), the chip select signal CS is inputted to the CS terminal of the ROM-type memory core 11 and the memory device 1 is operated as a general memory device having the ROM-type memory core 11 being $2^m \times n$ bits in length.

FIG. 4 is a connection diagram of the memory package 100 in which the memory device 1 of FIG. 1 having the ROM-type memory core 11 of FIG. 2 are stacked in two stage in the vertical direction. The memory package 100 shown in FIG. 4 is so constructed that the upper memory device 1 having one ROM-type memory core 11 is simply stacked on the lower memory device 1 having the other ROM-type memory core 11 in the vertical direction, to each of which pins for the chip select signal CS being one bit in length, the address signal A (m−1:0) being m bits in length, the reserve address signal A (m) being one bit in length and the data signal D (n−1:0) being n bits in length are all connected in common via the connection pattern 4. These pins for the chip select signal CS, address signal A (m−1:0) and data signal D (n−1:0) are also connected to the control circuit 31. The control circuit 31 has a function of controlling the ROM-type memory core 11 having a capacity, at least, twice or more as large as that of the control circuit 21. Moreover, the terminal for the select signal SEL connected to the lower memory device 1 having the ROM-type memory core 11 is connected to a terminal showing a logical potential L (i.e., ground potential GND) while the terminal of the selected signal SEL connected to the upper memory device 1 having the ROM-type memory core 11 is in a open state.

In the memory package 100 of FIG. 4 having such connecting configurations, if a logical voltage L (i.e., ground potential GND) is applied to the terminal for the reserve address signal A (m), the chip select signal CS is fed to the ROM-type memory core 11 of the lower memory device 1 and any inputting to the CS terminal of the ROM-type memory core 11 of the upper memory device is inhibited. On the other hand, if a logical voltage H (i.e., power-supply potential $V_{DD}$) is applied to the terminal of the reserve address signal A (m), the chip select signal CS is fed to the ROM-type memory core 11 of the upper memory device 1 and any inputting to the CS terminal of the ROM-type memory core 11 of the lower memory device is inhibited.

That is, when the reserve address signal A (m) is at the logical potential L (i.e., ground potential GND), the lower memory device 1 having the ROM-type memory core 11 is adapted to read data being $2^m \times n$ bits in length from the ROM, and when the reserve address signal A (m) is at the logical potential H (i.e., power-supply potential $V_{DD}$), the upper memory device 1 having the ROM-type memory core 11 is adapted to read data being $2^m \times n$ bits in length from ROM.

Therefore, supposing that the reserve address signal A(m) is of the most significant bit, the ROM-type memory core 11 having the ROM capacity being $2^{m+1} \times n$ bit in length is implemented which is obtained by adding a length $2^m \times n$ bits for the data signal D (n−1:0) from the upper memory device 1 to the length $2^m \times n$ bits for the data signal D (n−1:0) from the lower memory device 1 (i.e., $2^{m+1} \times n + 2^{m+1} \times n$). Thus, according to the first embodiment, by stacking memory devices 1 having the ROM-type memory core 11 in two stages in the vertical direction, two-fold memory capacity can be implemented on the same mounting area as would be required in the case of mounting in one stage. This is achieved, as described above, by providing the land 2 on the surface of the package composed of one memory device 1 having the ROM-type memory core and by stacking, on the land 2, the other memory device 1 also having the ROM-type memory core in two stages in the vertical direction and by mounting internal circuits, on the memory devices 1 having the ROM-type memory cores 11, adapted to control so that the address areas of the upper and lower memory devices 1 having the ROM-type memory cores 11 may not be overlapping.

Second Embodiment

Figure 5:
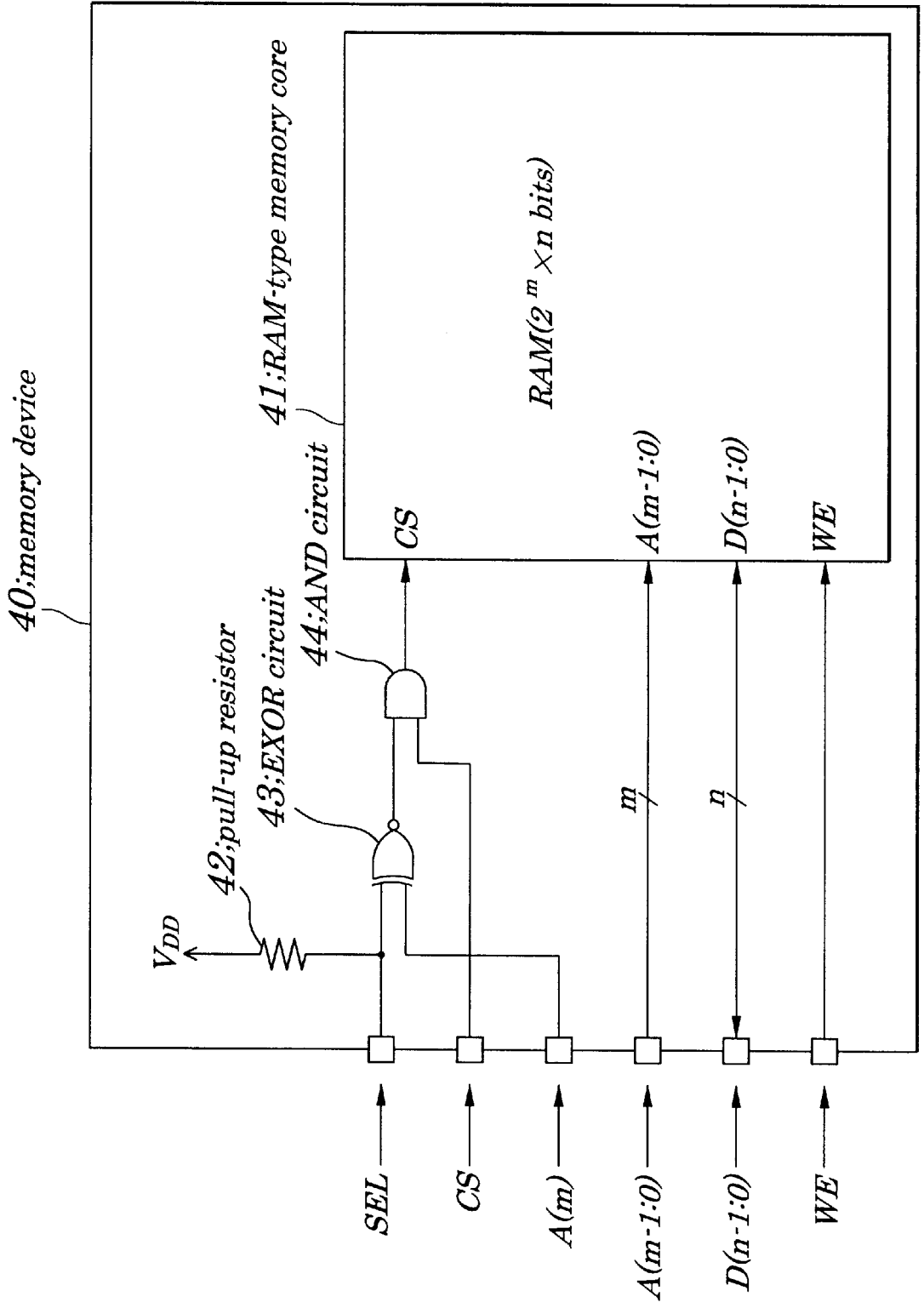
FIG. 5 is a schematic circuit diagram showing the memory device of FIG. 1 having the RAM-type memory core.
Figure 6:
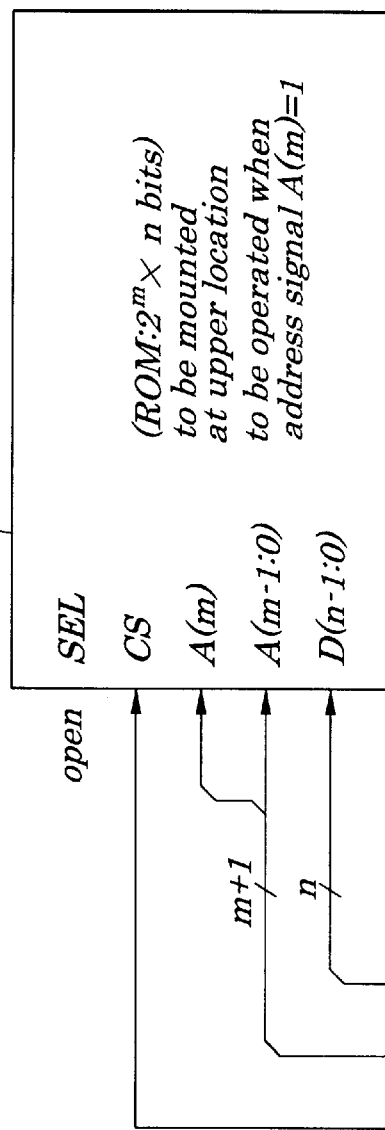
FIG. 6 is a connection diagram of the memory package in which the upper memory device having the ROM-type memory core of FIG. 2 and the lower memory device having the RAM-type memory core of FIG. 5 are stacked in two stages in a vertical direction.
Figure 6:
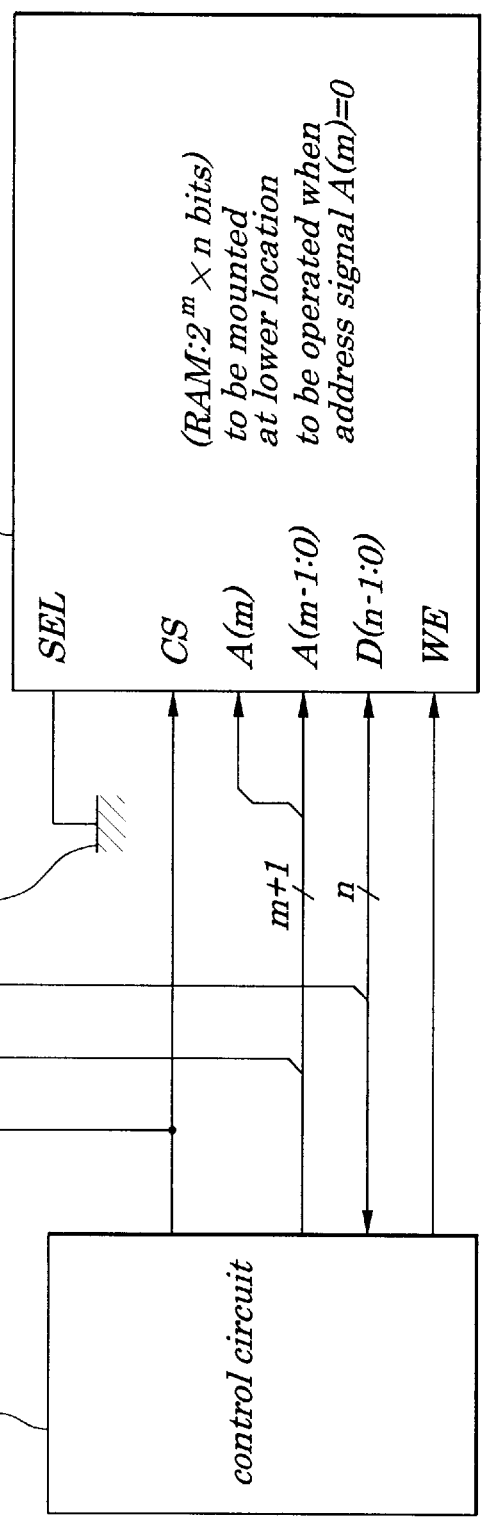
Figure 7:
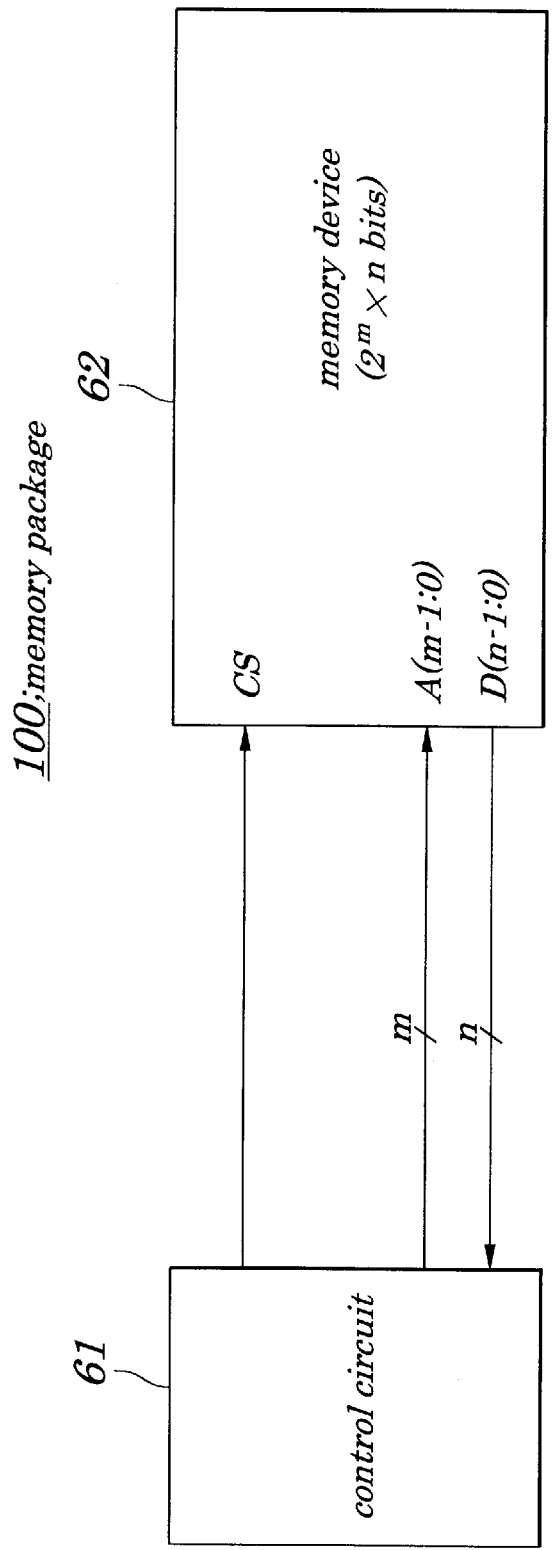
FIG. 7 is a schematic circuit diagram showing a conventional memory device.

FIG. 5 is a schematic circuit diagram showing the memory device 1 of FIG. 1 having a RAM-type memory core instead of the ROM-type memory core. According to a second embodiment, as shown in FIGS. 1 and 5, a memory package 100 is so configured that a memory device 1 having the ROM-type memory core 11 and a memory device 40 having a RAM-type memory core 41 are stacked up and down in two stages, thus allowing two-fold memory capacity to be implemented on the same mounting area as would be required in the case of mounting in one stage and two different memory functions (including ROM and RAM functions) to be achieved on the same mounting area as would be required in the case of mounting in one stage. FIG. 6 is a connection diagram of the memory package 100 in which the upper memory device having the ROM-type memory core of FIG. 2 and the lower memory device having the RAM-type memory core of FIG. 5 are stacked in two stages in a vertical direction.

As shown in FIGS. 1 and 6, both the memory device 1 having the ROM-type memory core 11 and the memory device 40 having the RAM-type memory core 41 are provided with the land 2, besides other components fabricated in accordance with the BGA packaging form. Moreover, electrical connection of all connection pins except the independent pin 5 between the lower memory device 1 and the upper memory device 40 is implemented by the connection in a one-to-one configuration through the connection pattern 4 between the land 2 mounted on the surface (i.e., on a surface on which another memory device is overlaid) of the lower memory device 40 having the RAM-type memory core 41 and the soldering ball 3 mounted at the bottom of the upper lower memory device 1 having the ROM-type memory core 11.

That is, by overlaying the memory device 1 having the ROM-type memory core 11 on the memory device 40 having the RAM-type memory core 41 (both of which are fabricated in accordance with the same BGA packaging form), up and down in two stages, and by electrically connecting the soldering ball 3 mounted at the bottom of the upper memory device 1 having the ROM-type memory core, in a one-to-one configuration, to the land 2 mounted on the surface of the lower memory device 40 having the RAM-type memory core, two-fold memory capacity can be implemented on the same mounting area as would be required in the case of mounting in one stage and two different memory functions (including ROM and RAM functions) can be achieved on the same mounting area as would be required in the case of mounting in one stage as well. Each of the memory device 1 having the ROM-type memory core 11 and the memory device 40 having the RAM-type memory core 41 is fabricated in accordance with the BGA packaging form and is provided with the soldering ball 3 on its bottom to achieve the connection of each connection pin. Also, each of the upper memory device 1 having the ROM-type memory core 11 and the lower memory device 40 having the RAM-type memory core 41 is provided with the land 2 on its surface being located at a position directly opposite, in a one-to-one configuration, to the soldering ball 3 mounted on the upper memory device 1.

Thus, according to this embodiment, the memory package 100 is so configured that the upper memory device 1 having the ROM-type memory core 11 is overlaid on the lower memory device 40 having the RAM-type memory core 41 in two stages in a vertical direction and that the soldering ball 3 mounted at the bottom of the upper memory device 1 meets the land 2 mounted on the surface of the lower memory device in a one-to-one configuration so as to be electrically connected.

Moreover, all connection pins 4 except the independent pin 5 of the memory device 1 having the ROM-type memory core 11 are electrically connected to those of the memory device 40 having the RAM-type memory core 41 through the one-to-one electrical connection of the soldering ball 3 to the land 2 using the connection pattern 4.

As depicted in FIG. 5, the memory device 40 having the RAM-type memory core contains, at least, terminals for an address signal A (m−1:0) being m bits in length, a data signal D (n−1:0) being n bits in length, a chip select signal CS, a reserve address signal A (m) being one bit in length, a select signal SEL and a write enable signal WE for the RAM, a RAM-type memory core 41, a pull-up resistor 42, an EXOR circuit 43 and an AND circuit 44.

The circuit of the memory device 1 is so configured that a logical operation of an output obtained as a result of a logical operation carried out by inputting the reserve address signal A (m) and a select signal SEL into the EXOR circuit 43 and of a chip select signal CS is performed in the AND circuit 14, and a result of the above logical operation is inputted as the chip select signal CS into a CS terminal of the RAM-type memory core 41, then the address signal A (m−1:0) as an address signal is inputted into an A terminal (m−1:0) of the RAM-type memory core 41, the data signal D (n−1:0) as a data signal is inputted into a D terminal (n−1:0) of the RAM-type memory core 41 and the write enable signal WE for the RAM is inputted into a WE terminal of the RAM-type memory core 41. The memory package of this embodiment can be fabricated by replacing the lower memory device 1 having the ROM-type memory core 11 used in the first embodiment in FIG. 1 with the memory device 40 having the RAM-type memory core 41 being $2^m \times n$ bits in length and additionally providing the pin for the write enable signal WE for the RAM. The pin for the write enable signal WE for the RAM can be connected to the independent pin 5 shown in FIG. 1 for which the land 2 on the surface of the lower memory device 40 is not connected to the soldering ball 3 mounted at the bottom of the upper memory device 1. The memory device 1 having the ROM-type memory core 11 as shown in FIG. 2 is overlaid on the memory device 40 having the RAM-type memory core 41 as shown in FIG. 5, and both memory devices 1, 40 are connected in a manner shown in FIG. 6.

As shown in FIG. 6, pins for the chip select signal CS being one bit in length, the address signal A (m−1:0) being m bits in length, the reserve address signal A (m) being one bit in length, the data signal D (n−1:0) in n bits in length are connected through the connection pattern 4 in common to each of the upper memory device 1 having the ROM-type memory core 11 and the lower memory device 40 having the RAM-type memory core 41. The pin (independent pin 5) for the write enable signal WE is connected to the lower memory device 40 having the RAM-type memory core 41. The select terminal SEL of the lower memory device 40 having the RAM-type memory core 41 is connected to a terminal of ground potential GND. The select terminal SEL of the upper memory device 1 having the ROM-type memory core 11 is in an open state. The pins for the chip select signal CS, the address signal A (m−1:0), the reserve address signal A (m) and the data signal D (n−1:0) are connected to a control circuit 51. The control circuit 51 has a function of controlling the ROM-type memory core 11 having a capacity, at least, twice or more as large as that of the control circuit 21.

The memory package 100 of the second embodiment is so configured that, when the reserve address signal A (m) is at the logical potential L (i.e., ground potential GND), the lower memory device 40 is operated as one memory device having the RAM-type memory core 41 being $2^m \times n$ bits in length, when the reserve address signal A (m) is at the logical potential H (i.e., power-supply potential $V_{DD}$), the upper memory device 1 is operated as the other memory device having the ROM-type memory core 11 being $2^m \times n$ bits in length, thus allowing two or more kinds of memory functions having the capacity (of both the ROM and RAM functions) to be implemented on the same mounting area as would be required in the case of mounting in one stage.

As described above, according to the second embodiment, two-fold memory capacity can be implemented on the same mounting area as would be required in the case of the conventional mounting. This is achieved, as described above, by providing the land 2 on the surface of the memory package 100 composed of one memory device 1 having the RAM-type memory core and by stacking, on the land 2, the other memory device 1 also having the ROM-type memory core in two stages in a vertical direction and by mounting the internal circuit, on the upper memory devices 1 having the ROM-type memory cores 11 and the lower memory device 40 having the RAM-type memory core 41, adapted to control so that the address areas of the upper and lower memory devices 1 and 40 having the ROM-type memory cores 11 and the RAM-type memory core 41 may not be overlapping.

It is apparent that the present invention is not limited to the above embodiments but may be changed and modified without departing from the scope and spirit of the invention. For example, in the above descriptions, the memory devices are stacked in two stages, however, according to the present invention, the memory device may be stacked in one stage or in three or more stages in a vertical direction. Moreover, the present invention is not limited to numbers, positions, shapes or a like of above-described components and any number, position, shape thereof may be chosen so as to be suitable to carry out this invention. The same reference number is assigned to the same component in each drawing.

Finally, the present application claims the priority based on Japanese Patent Application No.Hei11-014668 filed on Jan. 22, 1999, which is herein incorporated by reference.

What is claimed is:

1. A memory package for implementing two-fold memory capacity and two different memory functions on a same mounting area as required in a case of mounting in one stage comprising:

a plurality of memory devices each having a land formed at a predetermined position on a surface of said memory device on which another memory device is mounted and a connection pin formed at a bottom of said memory device which meets another land formed on another memory device in a one-to-one configuration at a position opposite to said land so as to be electrically connected to each other;

whereby said memory devices are stacked up and down in two stages so that said connection pins formed at the bottom of said upper memory device meet said lands formed at the predetermined position on the surface of said lower memory device on which said upper memory device is overlaid.

2. The memory package according to claim 1, wherein said land formed at the predetermined position on the surface of said memory device is connected, through a conductive connection pattern in a one-to-one configuration, to said connection pin formed at a position opposite to said land at the bottom of said memory device so that said land and said pin meet each other.

3. The memory package according to claim 1, wherein said memory device is fabricated in accordance with a Ball Grid Array packaging form.

4. The memory package according to claim 1, wherein each of said memory devices stacked in two stages is provided with a memory core having a same memory function and these two memory devices are so constructed that, in composite logical memory space produced by logically synthesizing one memory core being addressable by said upper memory device and the other memory core being addressable by said lower memory device, said one memory core being addressable by said upper memory device is located at an upper part of said composite logical memory space and said other memory core being addressable by said upper memory device is located at a lower part of said composite logical memory space.

5. The memory package according to claim 1, wherein each of said memory devices stacked in two stages is provided with memory cores each having at least two or more memory functions and these two memory devices are so constructed that, in composite logical memory space produced by logically synthesizing one memory core being addressable by said upper memory device and the other memory core being addressable by said lower memory device, said one memory core being addressable by said upper memory device is located at an upper part of said composite logical memory space and said other memory core being addressable by said lower memory device is located at a lower part of said composite logical memory space.

6. The memory package according to claim 4, further comprising a control circuit used to arrange said one memory core being addressable by said upper memory device at the upper part of said composite logical memory space and said other memory core being addressable by said lower memory device at the lower part of said composite logical memory space and to produce said composite logical memory space by logically synthesizing said one memory core being addressable by said upper memory device and said other memory core being addressable by said lower memory device and further to perform access to said one memory core of said upper memory device or to said other memory core of said lower memory device on the basis of said composite logical memory space.

7. The memory package according to claim 1, wherein each of said memory devices stacked up and down in two stages has a memory core with a same memory function and has pins for a chip select signal and for a reserve address signal used to produce a composite logical memory space by logically synthesizing a memory core being addressable by said upper memory device and said memory core being addressable by said lower memory device and wherein said one memory core being addressable by said upper memory device is arranged at the upper part of said composite logical memory space and said other memory core being addressable by said lower memory device at the lower part of said composite logical memory space depending on a logical level provided to pins for said chip select signal and for said reserve address signal.

8. The memory package according to claim 1, wherein each of said memory devices stacked up and down in two stages has a memory core with at least two or more memory functions and has pins for a chip select signal and for a reserve address signal used to produce said composite logical memory space by logically synthesizing said one memory core being addressable by said upper memory device and said other memory core being addressable by said lower memory device and wherein said one memory core being addressable by said upper memory device is arranged at the upper part of said composite logical memory space and said other memory core being addressable by said lower memory device at the lower part of said composite logical memory space depending on a logical level provided to pins for a chip select signal and for a reserve address signal.

9. The memory package according to claim 7, further comprising a control circuit used to arrange said one memory core being addressable by said upper memory device at the upper part of said composite logical memory space and said other memory core being addressable by said lower memory device at the lower part of said composite logical memory space depending on the logical level provided to said pins for said chip select signal and for said reserve address signal and to produce said composite logical memory space by logically synthesizing said one memory core being addressable by said upper memory device and said memory core being addressable by said other lower memory device and further to perform access to said memory core of said upper memory device or to said memory core of said lower memory device on the basis of said composite logical memory space.

10. The memory package according to claim 1, wherein said memory core is provided with ROM functions.

11. The memory package according to claim 1, wherein said memory core is provided with RAM functions.

* * * * *